United States Patent [19]

Shin

[11] Patent Number: 5,180,466
[45] Date of Patent: Jan. 19, 1993

[54] PROCESS FOR DRY ETCHING A SILICON NITRIDE LAYER

[75] Inventor: Teshiki Shin, Kawasaki, Japan

[73] Assignee: Fujitsu Limited, Kanagawa, Japan

[21] Appl. No.: 681,473

[22] Filed: Apr. 4, 1991

Related U.S. Application Data

[63] Continuation of Ser. No. 287,564, Dec. 19, 1988, abandoned, which is a continuation of Ser. No. 143,302, Jan. 11, 1988, abandoned, which is a continuation of Ser. No. 813,896, Dec. 27, 1985, abandoned.

[30] Foreign Application Priority Data

Dec. 29, 1984 [JP] Japan .................. 59-280138

[51] Int. Cl.$^5$ .............................. H01C 21/00
[52] U.S. Cl. .................... 156/643; 156/646; 156/653; 156/157; 156/659.1; 156/662
[58] Field of Search ............ 156/646, 643, 653, 659.1, 156/662, 657

[56] References Cited

U.S. PATENT DOCUMENTS

| | | | |
|---|---|---|---|
| 4,473,435 | 9/1984 | Zafiropoulo et al. | 156/646 |
| 4,529,476 | 7/1985 | Kawamoto et al. | 156/646 |
| 4,581,101 | 4/1986 | Senoue et al. | 156/646 |
| 4,601,782 | 7/1986 | Bianchi et al. | 156/646 |
| 4,666,555 | 5/1987 | Tsang | 156/646 |

FOREIGN PATENT DOCUMENTS

| | | |
|---|---|---|
| 0109706 | 5/1984 | European Pat. Off. |
| 3420347 | 12/1984 | Fed. Rep. of Germany |
| 58-7829 | 1/1983 | Japan |
| 58-84113 | 5/1983 | Japan |
| 59-51531 | 3/1984 | Japan |
| 59-214226 | 12/1984 | Japan |
| 60-20516 | 2/1985 | Japan |

OTHER PUBLICATIONS

Bienvogl, H. R. et al. "Plasma Etching of Polysilicon and $Si_3N_4$ in $SF_6$ with Some Impact on MOS Device Characteristics." *IEEE Transactions on Electron Devices*, vol. ED-28, No. 11 (Nov. 1981), pp. 1333–1337.

*Primary Examiner*—Thi Dang
*Attorney, Agent, or Firm*—Armstrong & Kubovcik

[57] ABSTRACT

A silicon nitride layer, particularly on a silicon dioxide layer, is dry etched successfully by using an etching gas including $SF_6$, preferably also $CH_2F_2$. This dry etching provides a high selectivity of etching of $Si_3N_4$ to $SiO_2$ and may be used for the LOCOS (local oxidation of silicon) process to reduce the width of so-called "bird beaks."

10 Claims, 4 Drawing Sheets

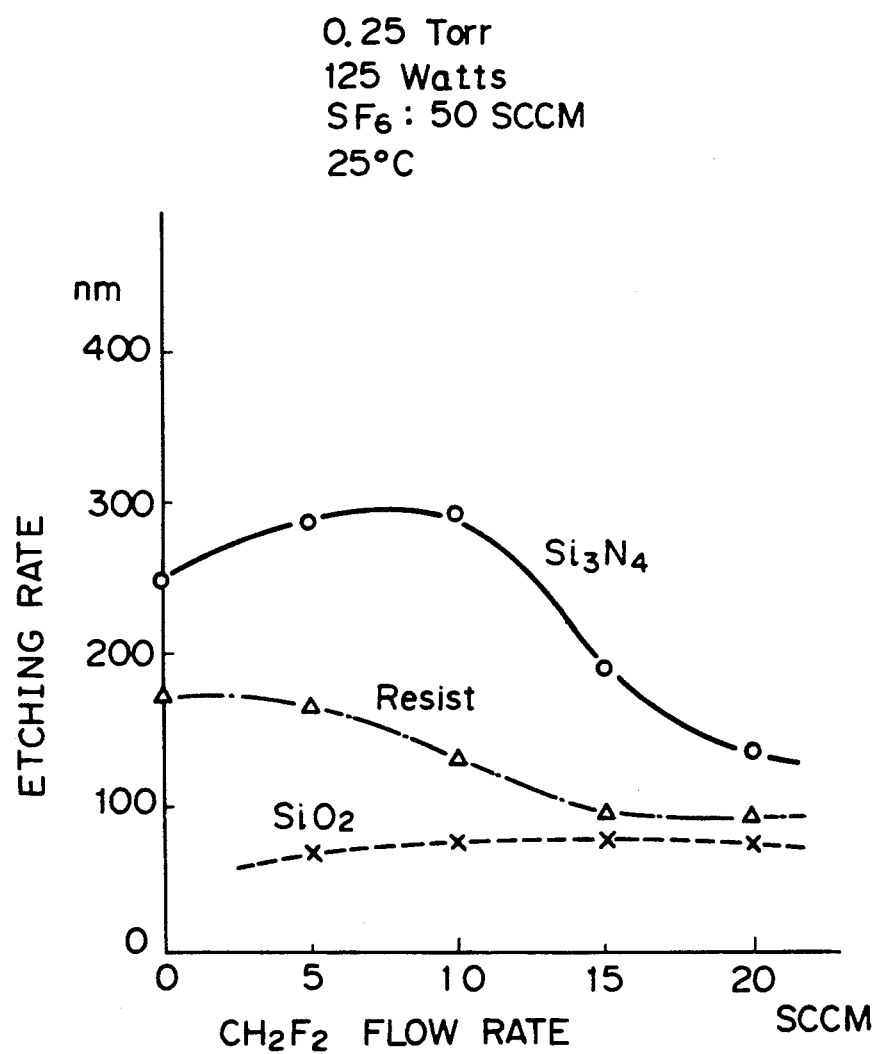

PROCESS FOR DRY ETCHING A SILICON NITRIDE LAYER

This application is a continuation of application Ser. No. 287,564, filed on Dec. 19, 1988, now abandoned which is a continuation of Ser. No. 143,302, filed on Jan. 11, 1988, now abandoned, which is a continuation of Ser. No. 813,896, filed on Dec. 27, 1985, now abandoned.

BACKGROUND OF THE INVENTION

1. Field of the Invention

The present invention relates to a process for etching a silicon nitride layer. Move specifically, it relates to a process for dry etching a silicon nitride layer on a silicon dioxide layer, useful in a so-called "local oxidation of silicon" (LOCOS) process.

2. Description of the Related Art

A silicon nitride ($Si_3N_4$) layer is used as a mask for locally oxidizing a semiconductor bulk, such as a silicon bulk. In this process (LOCOS), the overall surface of a silicon bulk is first oxidized to a thin thickness, e.g., 50 nm. Then, an $Si_3N_4$ layer of, e.g., 100 nm thickness is formed on the oxidized surface of the silicon bulk. The $Si_3N_4$ layer is patterned with a mask of a patterned resist layer formed on the $Si_3N_4$ layer, the resist layer is removed, then the silicon bulk is locally oxidized by using the patterned $Si_3N_4$ layer as a mask.

In this local oxidation process, there is the problem of formation of "bird beaks". That is, oxidation of the silicon bulk occurs not only vertically downward from the top surface of a portion of the silicon bulk not covered with the $Si_3N_4$ layer as mask but also horizontally toward a portion under the $Si_3N_4$ layer. These "bird beaks" create undesired wasteful areas in microcircuit devices, preventing densification of integrated circuit (IC) devices.

It is known that by decreasing the thickness of a silicon dioxide ($SiO_2$) layer formed on the surface of the silicon bulk and increasing the thickness of an $Si_3N_4$ layer or a mask layer for oxidation on the $SiO_2$ layer, it is possible to reduce the size of "bird beaks" formed during the local oxidation. However, no currently available etching process allows a desired combination of the thicknesses of the $SiO_2$ and $Si_3N_4$ layers. An etching gas comprising fluoromethane (feron), particularly tetrafluoromethane ($CF_4$), and oxygen ($O_2$) is typically used for dry etching an $Si_3N_4$ layer in the LOCOS process, which gas needs the above mentioned combination of thicknesses of the $SiO_2$ and $Si_3N_4$ layers of e.g., 50 nm and 100 nm, respectively, since the above etching gas has a ratio of etching rate of $Si_3N_4$ to $SiO_2$ of about 2 to 3 at the highest. The above combination of the thicknesses of the two layers, i.e., 50 nm of the $SiO_2$ layer and 100 nm of the $Si_3N_4$ layers, not only requires severe control of the process conditions, but also results in "bird beaks" each having a width or lateral size of 0.3 to 0.4 $\mu m$.

If the thickness of the $SiO_2$ layer is further reduced in the above prior art process, the $SiO_2$ layer may be over etched during the patterning or etching of an $Si_3N_4$ layer on the $SiO_2$ layer, which causes nonuniform oxidation of the silicon bulk existing under the $SiO_2$ layer.

There are also known other dry etching gases, for example, a mixed gas of sulfur hexafluoride ($SF_6$) and chlorine ($Cl_2$) for etching silicon (Japanese Unexamined Patent Publication (Kokai) No. 58-7829); a gas of $SF_6$, nitrogen trifluoride ($NF_3$), fluorine ($F_2$), or $Cl_2$ for etching silicon (Japanese Unexamined Patent Publication (Kokai) No. 59-214226); a gas of $NF_3$ for etching $Si_3N_4$ (Japanese Unexamined Patent Publication (Kokai) No. 60-20516); a reactive gas mixture comprising predominantly a fluorocarbon gas doped with carbon dioxide for etching an inorganic insulating layer comprising silicon as a main metal element (Japanese Unexamined Patent Publication (Kokai) No. 58-84113); and a combination of a fluorine-system gas such as $SF_6$ or $CF_4$ gas and a carbon-system gas such as ethylene ($C_2H_4$) or carbon terachloride ($CCl_4$) for etching polycrystalline or crystalline silicon (Japanese Unexamined Patent Publication (Kokai) No. 59-51531). However, some of these publications, disclosing $SF_6$ as a dry etching gas, do not concern etching of $Si_3N_4$ and the others, disclosing a gas for dry etching $Si_3N_4$, are not very effective.

SUMMARY OF THE INVENTION

The main object of the present invention is to provide an effective dry etching process for etching $Si_3N_4$.

A further object of the present invention is to provide a dry etching process having a high ratio of etching rate of $Si_3N_4/SiO_2$, useful for the LOCOS process.

A still further object of the present invention is to reduce the size of "bird beaks" formed in the LOCOS process in order to densify semiconductor IC devices.

These and other objects are attained by a process for dry etching an $Si_3N_4$ layer with an etching gas comprising $SF_6$. This invention is based on a finding that $SF_6$ has a high effectivity of etching $Si_3N_4$ and a high selectivity of etching $Si_3N_4$ in relation to $SiO_2$ or a photoresist.

The etching gas optionally further comprises, e.g., fluoromethane such as $CH_3F$, $CH_2F_2$, $CHF_3$, and $CF_4$. A combination of $SF_6$ and $CH_2F_2$ is preferred.

We further found that anode coupling reactive ion etching is preferable in a process for dry etching an $Si_3N_4$ layer on an $SiO_2$ layer with an etching gas comprising $SF_6$ and optionally $CH_2F_2$ since it allows a higher etching rate ratio of $Si_3N_4/SiO_2$, although other types of dry etching, for example, cathode coupling type, reactive ion etching, and downflow type plasma etching, may have some advantages in a process according to the present invention.

BRIEF DESCRIPTION OF THE DRAWINGS

FIG. 3 is a graph of the etching rates of $Si_3N_4$, $SiO_2$, and resist when the flow rate of $CH_2F_2$ is varied.

DESCRIPTION OF THE PREFERRED EMBODIMENTS

Figure 1:
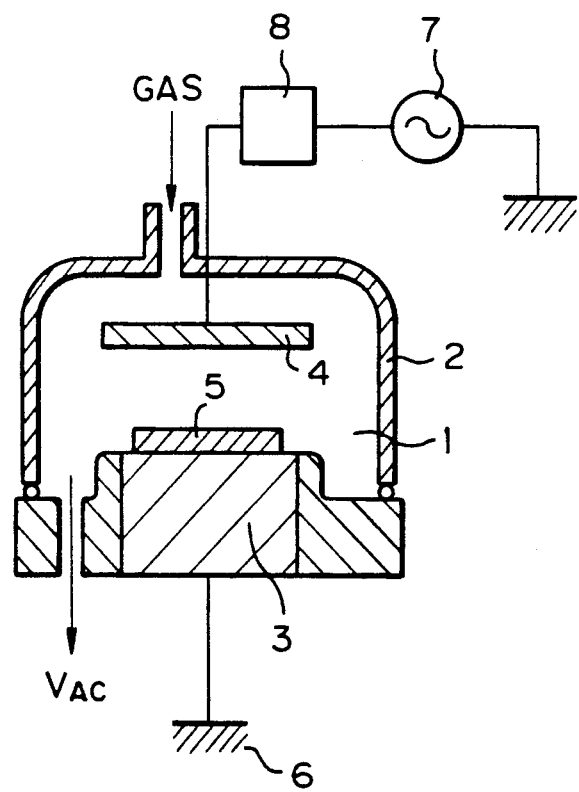
FIG. 1 is a schematic sectional view of an apparatus for dry etching used in a process according to the present invention.

FIG. 1 illustrates an anode coupling type dry etching apparatus. In a reaction chamber 1 defined by a quartz tube 2, there are parallel electrodes 3 and 4. An upper side electrode 4 is made of aluminum (Al) and anodized on its surface, and a lower side electrode 4 is made of aluminum on which a wafer 5 to be treated is placed. The lower side electrode 3 is connected to the ground 6, and the upper side electrode 3 is connected to a radio frequency (RF) source 7 of 13.56 MHz. A matching network 8 is inserted between the upper side electrode 3 and the RF source 7. The reaction chamber 1 is evacuated by a vacuum pump (not shown).

Now, an example of the LOCOS process according to the present invention is described with reference to FIGS. 1, 2A, 2B, and 2C. In FIG. 1 a silicon (Si) bulk or wafer 11 was prepared and a surface of the silicon bulk 11 was oxidized to form an $SiO_2$ layer 12 of 30 nm thickness. An $Si_3N_4$ layer 13 was deposited onto the $SiO_2$ layer 12 by sputtering, etc. The thickness of the $Si_3N_4$ layer 13 was 100 nm in this case, but could have also been made 150 nm. A resist layer 14 was coated on the $Si_3N_4$ layer 13 and patterned to leave a square or rectangular shape having a size L of 2.5 μm.

Figure 2A:
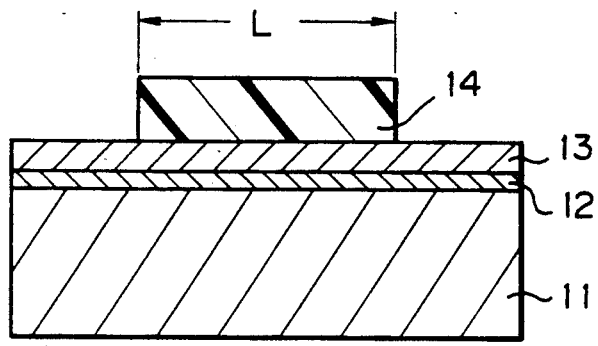
FIGS. 2A, 2B, and 2C are sectional views of a silicon bulk to be locally oxidized in some steps of the LOCOS process according to the present invention.
Figure 2B:
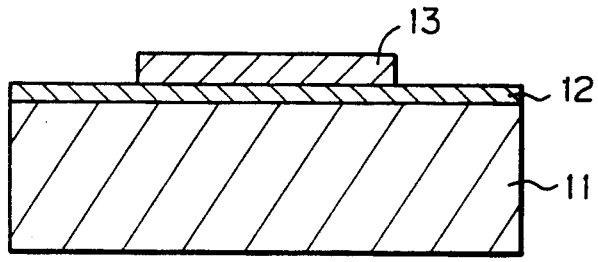

In a dry etching apparatus as in FIG. 1, the wafer 1 was placed on the lower side electrode 3. A reaction gas of a mixture of $SF_6$ and $CH_2F_2$ with flow rates of 50 SCCM (standard cubic centimeter per minute) and 10 SCCM respectively, was introduced into the reaction chamber 1, which was evacuated to about 0.25 Torr. A radio frequency of 13.56 MHz was applied between the two electrodes 3 and 4 at a power of about 125 Watts. By reactive ion etching under these conditions, a portion of the $Si_3N_4$ layer 13, which was not covered with the patterned resist layer 14, was selectively etched or removed. The resist layer 14 was then removed. Thus, a patterned $Si_3N_4$ layer 13 was obtained on the $SiO_2$ layer 12; the patterned $Si_3N_4$ layer 13 having a square or rectangular shape, as shown in FIG. 2B.

Figure 2C:
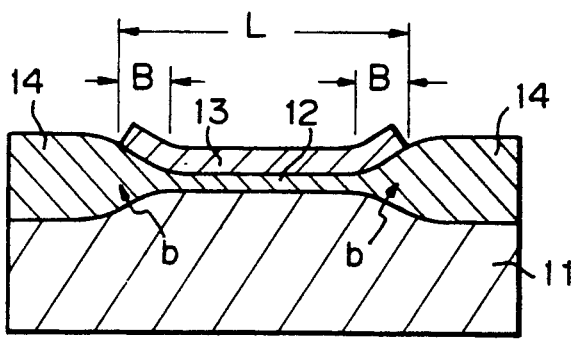

Referring to FIG. 2C, oxidation was carried out in which the patterned $Si_3N_4$ layer 13 was used as a mask to locally oxidize the silicon bulk 11, that is, a portion of the silicon bulk 11 above which no $Si_3N_4$ layer exists was oxidized to form a thick $SiO_2$ layer 14 or a locally oxidized silicon. In this oxidation, "bird beaks" b were formed but had the width B of only 0.2 μm to 0.3 μm which was reduced from the width of the "bird beaks" in the prior art.

In the prior art, for example, using an etching gas comprising $CF_4$ and $O_2$, as described before, the thickness of the $SiO_2$ layer had to be 50 nm if the $Si_3N_4$ layer had a thickness of 100 nm. This resulted in a width of the "bird beaks" of 0.3 μm to 0.4 μm after patterning the $Si_3N_4$ layer and oxidizing the silicon bulk under the $SiO_2$ layer using the $Si_3N_4$ layer as a mask.

In another experiment, the thickness of an $Si_3N_4$ layer was made 150 nm while maintaining the thickness of an $SiO_2$ layer at 30 nm. Successful selective etching of the $Si_3N_4$ layer could be done, that is, the $SiO_2$ layer was not overetched, resulting in excellent local oxidation of a silicon bulk under the $SiO_2$ layer.

Tests were made to ascertain preferable conditions of dry etching according to the present invention.

First, the flow rate of $CH_2F_2$ was varied with the other conditions being fixed. The fixed conditions of the test were vacuum of 0.25 Torr, RF power of 125 Watts, flow rate of the $SF_6$ of 50 SCCM, and temperature of 25° C. Thus, the etching rates of an $Si_3N_4$ layer, an $SiO_2$ layer, and a resist layer (novolak resin-containing positive-type photosensitive resist, "ONPR-800 HS1," produced by Tokyo Oka K. K., Japan) were determined.

Figure 4:
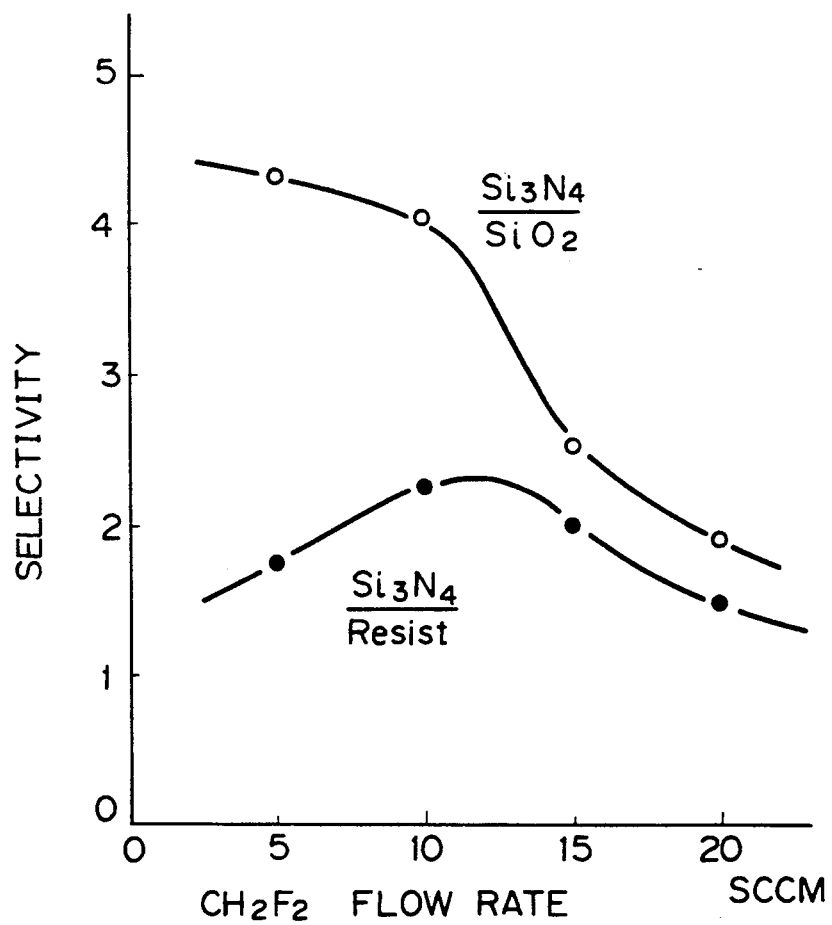
FIG. 4 is a graph of the selectivities of etching of $Si_3N_4$ to $SiO_2$ and resist when the flow rate of $C_2H_2$ is varied.

The obtained etching rates and the selectivities of $Si_3N_4$ to $SiO_2$ and resist or ratios of the etching rate of $Si_3N_4$ to $SiO_2$ and resist, respectively, are summarized in the graphs in FIGS. 3 and 4.

As can be seen in FIGS. 3 and 4, a flow rate of $CH_2F_2$ in a range of 17.5 SCCM or less, preferably in a range of 4 to 12 SCCM, results in successful selectivity of etching of $Si_3N_4$ to $SiO_2$. It should be noted that a selectivity of etching of $Si_3N_4$ to $SiO_2$ of more than 3, particularly, more than 4, was obtained in a process according to the present invention while at the highest only a selectivity of 2 to 3 could be obtained in a process in the prior art. It should be also noted that a relatively high selectivity of etching of $Si_3N_4$/resist was obtained and is also preferable.

Thus, a mixing ratio by volume or mole of $CH_2F_2$:$SF_6$ of up to 35:100, more preferably 8-24:100, particularly 20:100, is preferably used in a process according to the present invention. This fact was ascertained in another test in which the flow-rate of $SF_6$ is varied with the other conditions being fixed.

A third test in which the degree of vacuum in a reaction chamber was varied and the other conditions were fixed was carried out. We found that a vacuum of 0.1 to 0.3 Torr, more preferably 0.2 to 0.3 Torr, is preferably used.

A fourth test in which the RF power was varied and the other conditions were fixed was carried out. We found that 50 Watts was sufficient and 100 to 200 Watts was preferable for a process according to the invention.

I claim:

1. A process for substantially selective dry etching of unmasked $Si_3N_4$ in preference to $SiO_2$ and a photoresist mask, wherein unmasked $Si_3N_4$, in the presence of $SiO_2$ and said photoresist mask are dry etched in a gas comprising $SF_6$ and $CH_2F_2$, mixed in a ratio between 100:8 and 100:24 at a pressure of 0.10 Torr or higher.

2. A process according to claim 1, wherein the dry etching process is anode coupled reactive ion etching.

3. A process according to claim 2, wherein an RF power source for reactive ion etching is operated at a power level of between 50 to 200 Watts.

4. A process according to claim 3, wherein the RF source is operated at a power level between 100 and 200 Watts at an RF frequency of 13.56 MHz.

5. A process according to claim 1, wherein said silicon dioxide is a layer having a thickness of less than 50 nm and said silicon nitride is a layer having a thickness of 100 nm to 200 nm.

6. A process according to claim 1, wherein said silicon dioxide is a layer having a thickness of about 30 nm and said silicon nitride is a layer having a thickness of 100 nm to 150 nm.

7. A process according to claim 1, wherein said pressure is between 0.2 Torr and 0.3 Torr.

8. A process according to claim 1, wherein the $Si_3N_4$ is disposed over the $SiO_2$.

9. A process according to claim 1, wherein the $Si_3N_4$ is disposed beneath the $SiO_2$.

10. A process according to claim 1, wherein the $Si_3N_4$ and $SiO_2$ are layered on a silicon substrate.

* * * * *